US009814162B2

(12) United States Patent
Zhu et al.

(10) Patent No.: US 9,814,162 B2
(45) Date of Patent: Nov. 7, 2017

(54) DATA CENTER MICRO-MODULE AND DATA CENTER FORMED BY MICRO-MODULES

(71) Applicant: Tencent Technology (Shenzhen) Company Limited, Shenzhen (CN)

(72) Inventors: Liwei Zhu, Shenzhen (CN); Dianlin Li, Shenzhen (CN); Xiaowei Yang, Shenzhen (CN); Hua Zhu, Shenzhen (CN); Wenpeng Xu, Shenzhen (CN)

(73) Assignee: TENCENT TECHNOLOGY (SHENZHEN) COMPANY LIMITED, Shenzhen, Guangdong Province (CN)

( * ) Notice: Subject to any disclaimer, the term of this patent is extended or adjusted under 35 U.S.C. 154(b) by 57 days.

(21) Appl. No.: 14/682,972

(22) Filed: Apr. 9, 2015

(65) Prior Publication Data

US 2015/0359144 A1 Dec. 10, 2015

Related U.S. Application Data

(63) Continuation of application No. PCT/CN2013/085174, filed on Oct. 14, 2013.

(30) Foreign Application Priority Data

Oct. 15, 2012 (CN) .......................... 2012 1 0388782

(51) Int. Cl.
*H05K 7/20* (2006.01)
*G06F 1/30* (2006.01)
(Continued)

(52) U.S. Cl.
CPC ......... *H05K 7/20736* (2013.01); *G06F 1/181* (2013.01); *G06F 1/305* (2013.01); *H05K 7/1497* (2013.01)

(58) Field of Classification Search
CPC .. H05K 7/20572; H05K 7/206; H05K 7/2069; H05K 7/20618; H05K 7/20736;
(Continued)

(56) References Cited

U.S. PATENT DOCUMENTS 6,987,673 B1 * 1/2006 French ............... H05K 7/20718
312/223.2
7,902,966 B1 * 3/2011 Beitelmal ............... G06F 1/206
236/49.3
(Continued)

FOREIGN PATENT DOCUMENTS

CN 102339087 A 2/2012
CN 102339111 A 2/2012

OTHER PUBLICATIONS

Tencent Technology, Written Opinion, PCT/CN2013/085174, dated Jan. 16, 2014, 8 pgs.
(Continued)

*Primary Examiner* — Zachary M Pape
*Assistant Examiner* — Amir Jalali
(74) *Attorney, Agent, or Firm* — Morgan, Lewis & Bockius LLP (57) ABSTRACT

A data center micro-module includes: an enclosure, and a cabinet system, a power supply system, and a cooling system that are inside the enclosure. The cabinet system installs a computing server, the power supply system supplies power for the computing server and the cooling system, and the cooling system cools the computing server; and the enclosure is further externally provided with an interface configured to connect to another data center micro-module or connection apparatus. The foregoing data center micro-module integrates the power supply system, the cooling system and the computing server into a same module, and therefore can be directly manufactured in a factory. When a data center is built, the data center micro-modules only need
(Continued)

to be combined and assembled, which greatly reduces a construction cycle of the data center, and the hardware architecture may be flexibly changed according to a specific deployment requirement.

9 Claims, 6 Drawing Sheets

(51) Int. Cl.
*G06F 1/18* (2006.01)
*H05K 7/14* (2006.01)

(58) Field of Classification Search
CPC ............ H05K 7/20754; H05K 7/1497; H05K 7/20609; H05K 7/20709; H05K 7/20718; H05K 7/20727; G06F 1/20; G06F 1/206; G06F 1/181; G06F 1/305; G06F 2200/201
USPC .................. 361/695–696, 679.49–679.51
See application file for complete search history.

(56) References Cited

U.S. PATENT DOCUMENTS

| | | | | |
|---|---|---|---|---|
| 9,092,209 | B2* | 7/2015 | Sinha | G06F 21/81 |
| 9,414,519 | B2* | 8/2016 | Campbell | F28D 1/0471 |
| 2004/0265662 | A1* | 12/2004 | Brignone | H01M 8/04029 |
| | | | | 429/440 |
| 2006/0248360 | A1* | 11/2006 | Fung | G06F 1/206 |
| | | | | 713/300 |
| 2007/0165377 | A1* | 7/2007 | Rasmussen | H05K 7/2079 |
| | | | | 361/695 |
| 2007/0187343 | A1* | 8/2007 | Colucci | G06F 1/181 |
| | | | | 211/26 |
| 2007/0260417 | A1* | 11/2007 | Starmer | G01K 7/425 |
| | | | | 702/136 |
| 2008/0055846 | A1* | 3/2008 | Clidaras | G06F 1/20 |
| | | | | 361/679.41 |
| 2008/0060372 | A1* | 3/2008 | Hillis | H01L 23/467 |
| | | | | 62/259.2 |
| 2008/0064317 | A1* | 3/2008 | Yates | B65D 88/745 |
| | | | | 454/118 |
| 2008/0092577 | A1* | 4/2008 | Martin | G06F 1/206 |
| | | | | 62/259.2 |
| 2008/0313492 | A1* | 12/2008 | Hansen | G06F 1/206 |
| | | | | 714/5.11 |
| 2010/0106988 | A1* | 4/2010 | Hayashi | G06F 1/206 |
| | | | | 713/320 |
| 2010/0142544 | A1* | 6/2010 | Chapel | H01R 25/006 |
| | | | | 370/401 |
| 2010/0317278 | A1* | 12/2010 | Novick | H05K 7/20836 |
| | | | | 454/184 |
| 2011/0063792 | A1* | 3/2011 | Schmidt | G06F 1/20 |
| | | | | 361/679.46 |
| 2011/0077795 | A1* | 3/2011 | VanGilder | G06F 1/206 |
| | | | | 700/300 |
| 2011/0288664 | A1* | 11/2011 | Archibald | G06F 1/206 |
| | | | | 700/90 |
| 2011/0292601 | A1* | 12/2011 | Campbell | F24F 3/14 |
| | | | | 361/691 |
| 2012/0020009 | A1* | 1/2012 | Archibald | G06F 1/20 |
| | | | | 361/679.46 |
| 2012/0133510 | A1* | 5/2012 | Pierce | H04Q 1/026 |
| | | | | 340/540 |
| 2012/0136498 | A1* | 5/2012 | Chen | G06F 1/189 |
| | | | | 700/297 |
| 2012/0243160 | A1* | 9/2012 | Nguyen | G06F 1/181 |
| | | | | 361/679.08 |
| 2012/0243173 | A1 | 9/2012 | Archibald et al. | |

OTHER PUBLICATIONS

Tencent Technology, IPRP, PCT/CN2013/085174, dated Jun. 14, 2016, 5 pgs.

* cited by examiner

| | | |
|---|---|---|
| Management System 15 | | Power Distribution Unit 121 |
| Cooling Capacity Distribution Unit 131 | | Uninterruptible Power Supply 122 |
| Computing Server 24 | | Computing Server 24 |
| Air Conditioner 132 | | Air Conditioner 132 |
| Computing Server 24 | | Computing Server 24 |
| Computing Server 24 | | Computing Server 24 |
| Air Conditioner 132 | | Air Conditioner 132 |
| Computing Server 24 | | Computing Server 24 |
| Computing Server 24 | | Computing Server 24 |
| Air Conditioner 132 | | Air Conditioner 132 |
| Computing Server 24 | | Computing Server 24 |

FIG. 4

| | | |
|---|---|---|
| Management System 15 | | Power Distribution Unit 121 |
| Cooling Capacity Distribution Unit 131 | | Uninterruptible Power Supply 122 |
| Storage Server 34 | | Storage Server 34 |
| Air Conditioner 132 | | Air Conditioner 132 |
| Storage Server 34 | | Storage Server 34 |
| Storage Server 34 | | Storage Server 34 |
| Air Conditioner 132 | | Air Conditioner 132 |
| Storage Server 34 | | Storage Server 34 |
| Storage Server 34 | | Storage Server 34 |
| Air Conditioner 132 | | Air Conditioner 132 |
| Storage Server 34 | | Storage Server 34 |

DATA CENTER MICRO-MODULE AND DATA CENTER FORMED BY MICRO-MODULES

CROSS-REFERENCE TO RELATED APPLICATIONS

This application is a continuation application of PCT Patent Application No. PCT/CN2013/085174, entitled "DATA CENTER MICRO-MODULE AND DATA CENTER FORMED BY MICRO-MODULES" (also translated as "DATA CENTER MICRO-MODULE AND DATA CENTER CONSISTING OF MICRO-MODULES") filed on Oct. 14, 2013, which claims priority to Chinese Patent Application No. 201210388782.1, entitled "DATA CENTER MICRO-MODULE AND DATA CENTER FORMED BY MICRO-MODULES" filed on Oct. 15, 2012, both of which are incorporated by reference in their entirety.

FIELD OF THE TECHNOLOGY

The present disclosure relates to a data center, and in particular, to a data center micro-module, and a data center formed by micro-modules.

BACKGROUND OF THE DISCLOSURE

A data center is a production center, a processing center and a storage center for information and Internet services.

Figure 1:
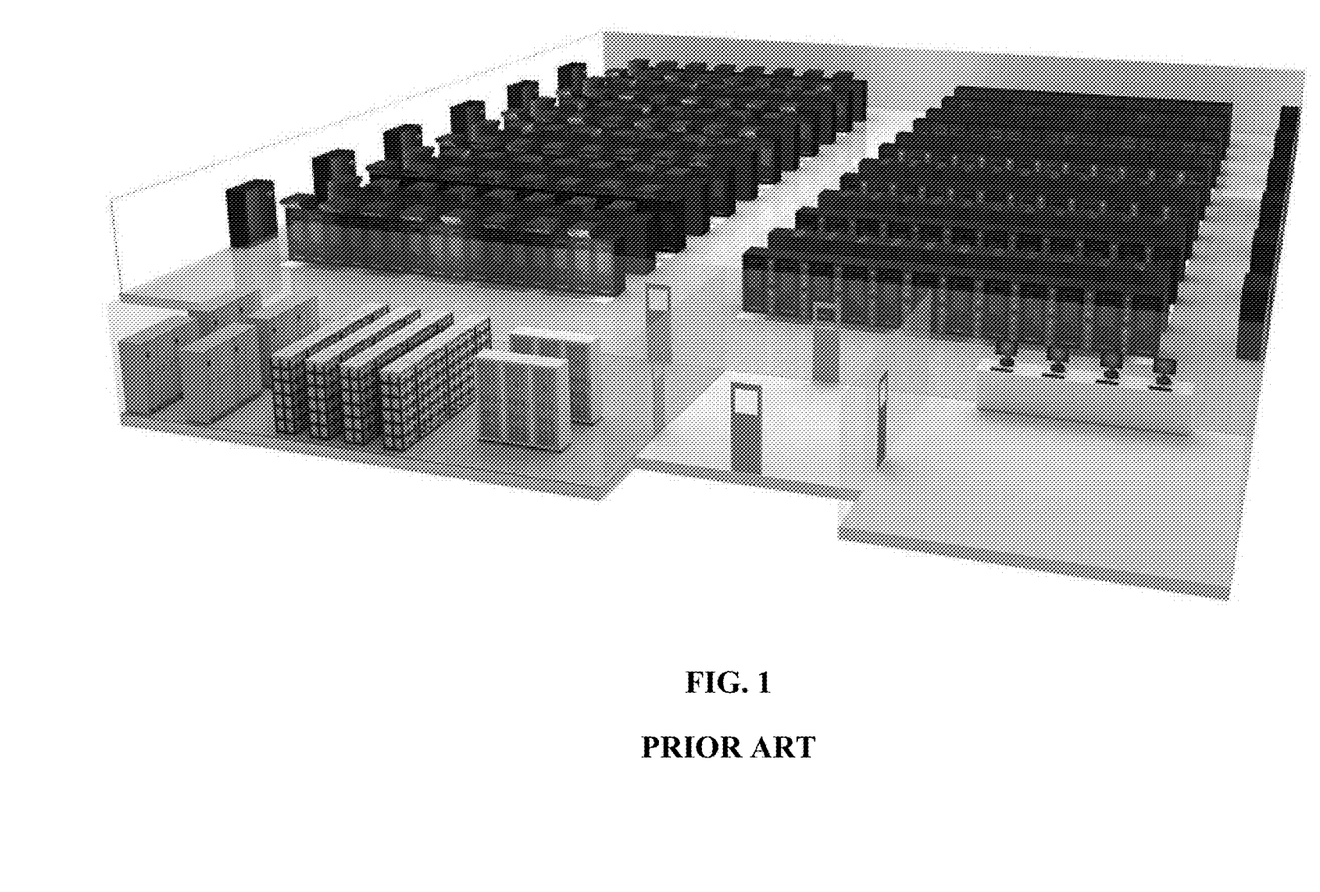
FIG. 1 is a schematic diagram of a conventional data center.

FIG. 1 is a schematic diagram of a typical data center. It can be seen that construction of a data center includes construction of IT devices (a server, a network, and so on) and construction of supporting infrastructures, such as a building, a power supply system, a cooling system, a cabinet system, and a management and control system (such as an access control system).

Information production, processing and storage determine that the data center must be a highly reliable and secure system. Due to rapidly growing requirements of information age, the data center needs to be built quickly to meet rapidly growing requirements of information age. Therefore, construction of the data center must be a requirement for high reliability, high security, a high speed, low costs, and high efficiency.

Figure 2:
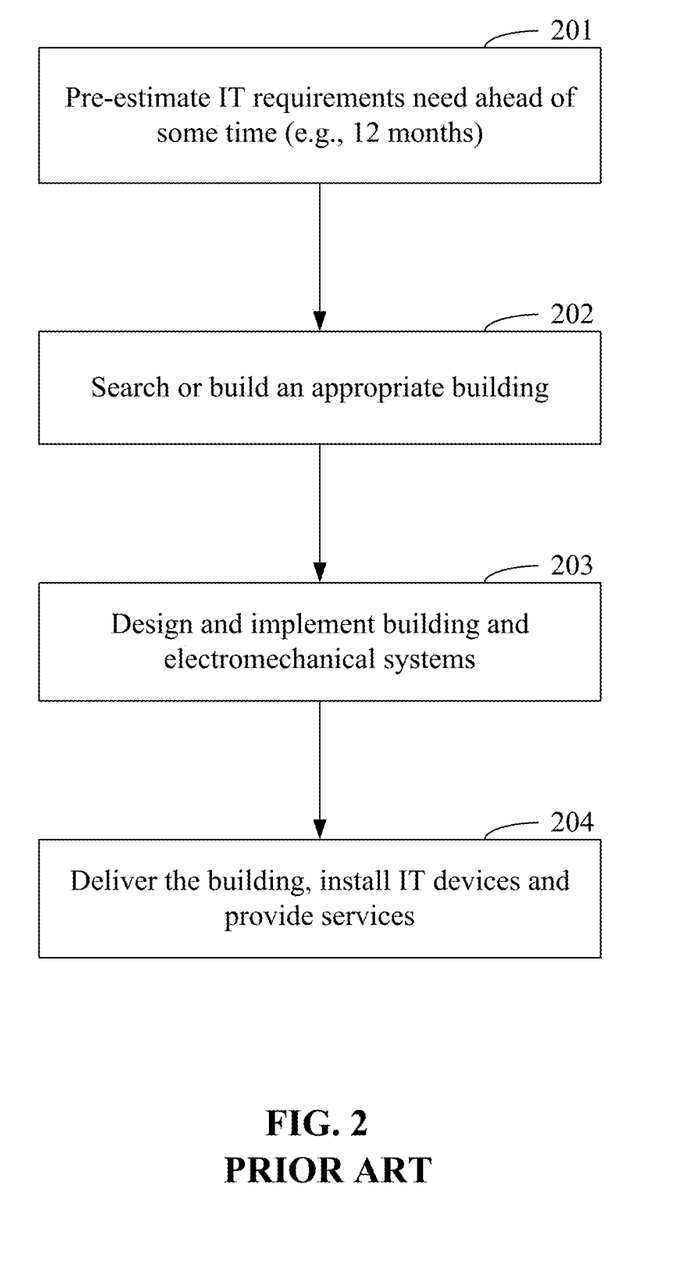
FIG. 2 is a schematic diagram of a construction process of a conventional data center.

However, in the existing technology, a solution for building a data center is based on building and electromechanical systems, and a general process of the solution is shown in FIG. 2. First, in step 201, IT requirements need to be pre-estimated ahead of some time (usually 12 months). Then, in step 202, an appropriate building is searched for or built. Then, in step 203, the building and electromechanical systems are designed/implemented. Finally, in step 204, IT devices can be installed to accomplish deployment and delivery. Defects of this manner are an excessively long construction cycle of the data center and high project costs. On the other hand, the development of the information industry varies from minute to minute, and hardware requirements of a required data center also change all the time; moreover, once a conventional data center is built, hardware deployment is difficult to be changed, which lacks flexibility. Furthermore, in a conventional data center, building, electromechanical and IT systems couple with each other, to become a complicated system, which lacks security and reliability assurance.

SUMMARY

In view of this, it is necessary to provide a data center micro-module, which can effectively reduce a construction cycle and construction costs of a data center, and can flexibly change the hardware architecture of the data center according to deployment.

A data center micro-module is provided, including: an enclosure, and a cabinet system, a power supply system, and a cooling system that are inside the enclosure; the cabinet system being configured to install a computing server, the power supply system being configured to supply power for the computing server and the cooling system, and the cooling system being configured to cool the computing server; and the enclosure being further externally provided with an interface configured to connect to another data center micro-module or connection apparatus.

In addition, an embodiment of the present application further provide a data center, the data center being assembled by the foregoing data center micro-modules, and the data center micro-modules being connected to each other by using a cable.

The foregoing data center micro-module integrates the power supply system, the cooling system and the computing server into a same module, and therefore can be directly manufactured in a factory. When a data center is built, the data center micro-modules only need to be combined and assembled, which greatly reduces a construction cycle of the data center, and the hardware architecture may be flexibly changed according to a specific deployment requirement, thereby reducing construction costs of the data center.

The foregoing descriptions are merely a summary of the technical solutions of the present disclosure. To make the technical means of the present disclosure to be understood more clearly, so as to be implemented according to contents of the specification, also to make the foregoing and other objectives, features and advantages of the present disclosure clearer and more understandable, preferred embodiments are described in detail below with reference to the accompanying drawings.

DESCRIPTION OF EMBODIMENTS

To further explain the technical means used in the present disclosure for achieving the intended objectives and the effects thereof, specific implementation manners, structures, features, and effects of the present disclosure are described in detail below with reference to the accompanying drawings and preferred embodiments.

Figure 3:
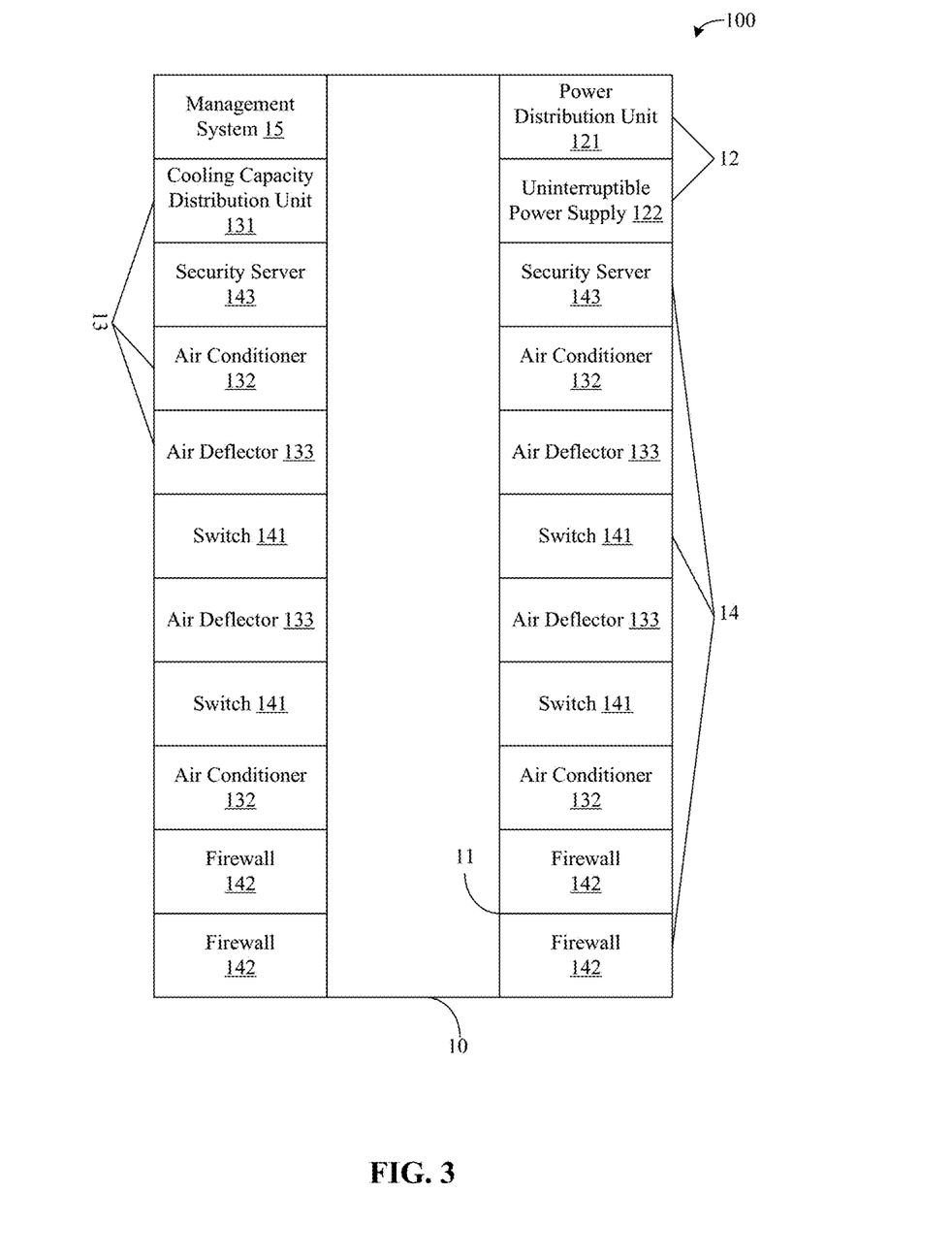
FIG. 3 is a schematic top view of a data center micro-module according to a first embodiment.

FIG. 3 is a schematic top view of a data center micro-module according to a first embodiment. As shown in FIG. 3, a data center micro-module 100 includes an enclosure 10. The enclosure 10 may, for example, be of a cuboid shape, as long as the size of the enclosure 10 is suitable for a specific requirement.

An installation foundation (which is not shown in the figure) is disposed at the bottom of the enclosure 10 and inside the enclosure 10. The installation foundation is configured to install a cabinet system 11, a power supply system 12 and a cooling system 13. The enclosure 10 is further externally provided with an interface configured to connect to another data center micro-module or connection apparatus. The foregoing interface, for example, includes a network interface, a power supply interface and an air-conditioner water-pipe interface. In addition, the enclosure 10 may be further externally provided with a buckle mechanism, so as to be pieced together with another data center micro-module.

For example a cabinet of the International Electrotechnical Commission (IEC) standard may be used as the cabinet system 11, and has a size of: width 600 mm*depth 1200 mm*40-54 standard heights U. It may be understood that one standard height U (1U) is 1.75 inches, which is equal to 44.45 mm after conversion. The cabinet system is configured to install a computing server 14.

In this embodiment, the computing server 14 may include a switch 141, a firewall 142 and a security server 143. The switch 141 is configured to accomplish transmission adjustment and switching functions of a core network. The firewall 142 and the security server 143 are used as a barrier of network security. Therefore, the data center micro-module in this embodiment may be regarded as a network module. The network module accomplishes high speed transmission and switching functions of the core network, and may also accomplish functions of such as security and a firewall.

The power supply system 12 is configured to supply power for the cooling system 13 and the computing server 14. It may be understood that the cooling system 13 and the computing server 14 usually need an alternating/direct current at a high voltage (for example, 220V or 380V). Therefore, the power supply system 12 includes a power distribution unit 121, configured to provide a suitable power supply for the cooling system 13 and the computing server 14. In addition, to ensure that the computing server 14 works uninterruptedly, the power supply system 12 may also include an uninterruptible power supply 122. Cabling of the power supply system 12 may be performed at the top of the enclosure 10.

The cooling system 13 may, for example, include a cooling capacity distribution unit 131, an air conditioner 132 and an air deflector 133. The cooling capacity distribution unit 131 is configured to control the air conditioner 132 to implement temperature control inside the enclosure 10. The air conditioner 132 is configured to adjust cooling capacity, and the air deflector is configured to accelerate air circulation to improve cooling efficiency. In addition, it may be understood that, besides a common air conditioner, the air conditioner 132 may also be an air conditioner with coolant, so as to implement a cooling solution of high efficiency and energy saving. The foregoing coolant is, for example, chilled water. In this case, the cooling capacity distribution unit 131 is configured to distribute chilled water or other coolant to multiple air conditioners 132. The air deflector 133 is configured to control the wind direction, and to implement temperature control inside the enclosure 10 along with the air conditioner 132.

Further, the data center micro-module 100 may further include a management system 15. The management system 15 may include an access control apparatus and a monitoring apparatus. The access control apparatus is configured to perform access control management, and the monitoring apparatus may be connected to the power supply system 12, the cooling system 13 and the computing server 14, and configured to monitor working states of the power supply system 12, the cooling system 13 and the computing server 14. The monitoring apparatus may also include a camera. The management system 15 may provide a touch screen to help an administrator for management, may also further include a network background management interface to help the administrator for remote management. Management systems 15 of multiple data center micro-modules form a complete cluster monitoring system.

The data center micro-module in this embodiment integrates the power supply system, the cooling system and the computing server into a same module, and therefore can be directly manufactured in a factory. When a data center is built, the data center micro-modules only need to be combined and assembled, which greatly reduces a construction cycle of the data center, and the hardware architecture may be flexibly changed according to a specific deployment requirement, thereby reducing construction costs of the data center.

Figure 4:
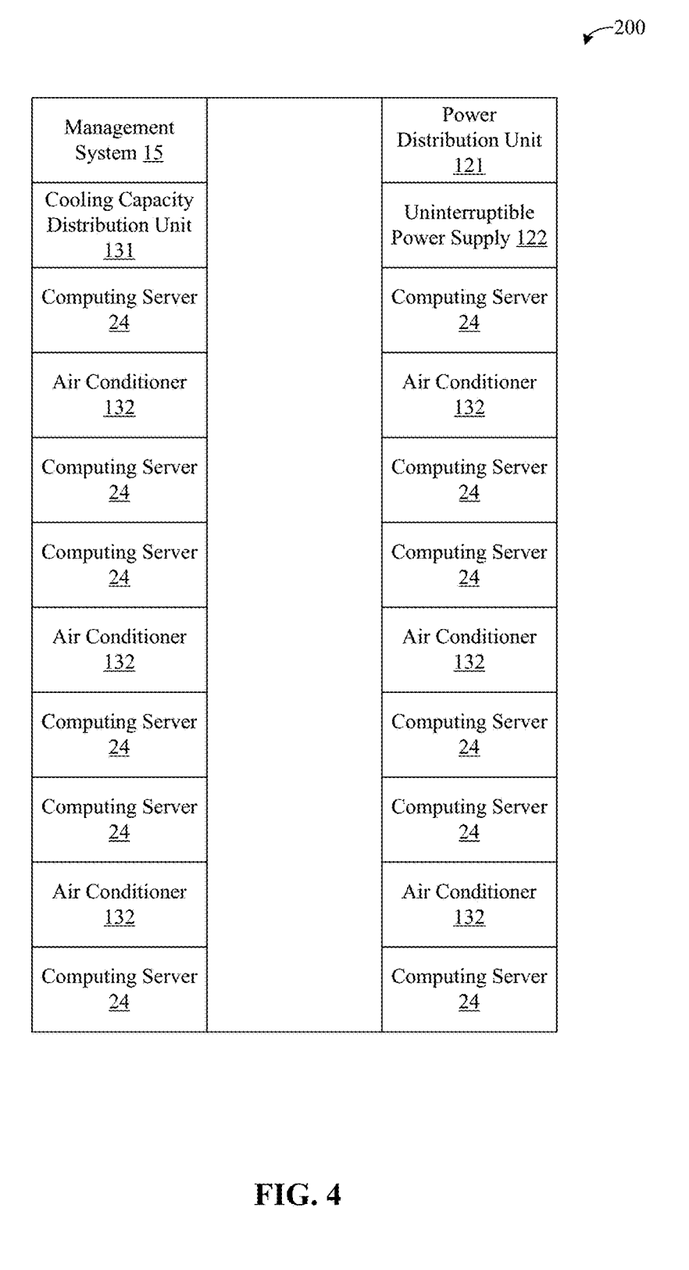
FIG. 4 is a schematic top view of a data center micro-module according to a second embodiment.

FIG. 4 is a schematic top view of a data center micro-module according to a second embodiment. As shown in FIG. 2, this embodiment is similar to the first embodiment, and a difference between them lies in that a computing server 24 in a data center micro-module 200 in this embodiment is a computing server. The computing server is mainly configured to provide user access and data caching services. The computing server is characterized by a large number, low costs, and high requirements for power supply and cooling. Therefore, the data center micro-module in this embodiment is a computing module. The computing module accomplishes Internet user access and data caching functions. This micro-module is formed by high-density computing-type servers and an access network.

Accordingly, as shown in FIG. 4, compared with FIG. 3, in the data center micro-module in this embodiment, an air deflector is no longer included, and the number of air conditioners 132 may be increased correspondingly, so as to process a higher amount of heat of the computing server. However, it may be understood that the actual number of the air conditioners may be increased or decreased according to a specific type and the number of computing servers 24.

In some cases, at least one side of each cabinet may be made to be adjacent to the air conditioner 132. In this way, cooling capacity of the data center micro-module may be improved, so as to adapt to requirements of a computing-type server to the greatest degree.

Compared with the first embodiment, the data center micro-module in this embodiment is more suitable for a situation with a high computing requirement. Further, the cooling capacity of the data center micro-module may also be enhanced.

Figure 5:
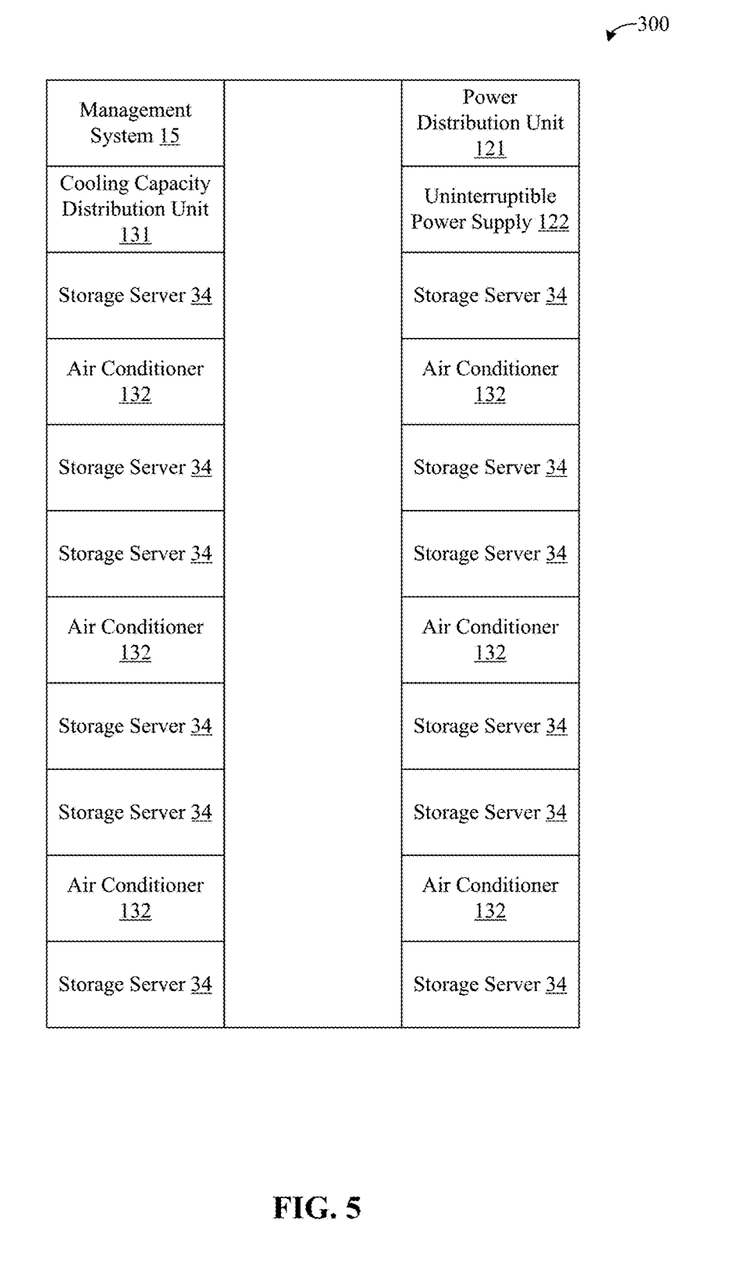
FIG. 5 is a schematic top view of a data center micro-module according to a third embodiment.

FIG. 5 is a schematic top view of a data center micro-module according to a third embodiment. As shown in FIG. 5, this embodiment is similar to the first embodiment, and a difference between them lies in that a storage server 34 in a data center micro-module 300 in this embodiment is a storage server. It may be understood that, the storage server is characterized by use of devices such as a large number of hard disks, a low requirement for computing capacity, and relatively little generated heat. Therefore, the data center micro-module 300 in this embodiment is a storage module. The storage module implements a storage function of a database of cloud computing services, and is formed by medium-density storage servers and an access network.

Therefore, for full use of the space, compared with the first embodiment, an air deflector is left out, and the saved space is used for placing the storage server.

The data center micro-module in this embodiment, compared with the first embodiment, leaves out the air deflector according to features of the storage server, to make full use of the space.

Figure 6:
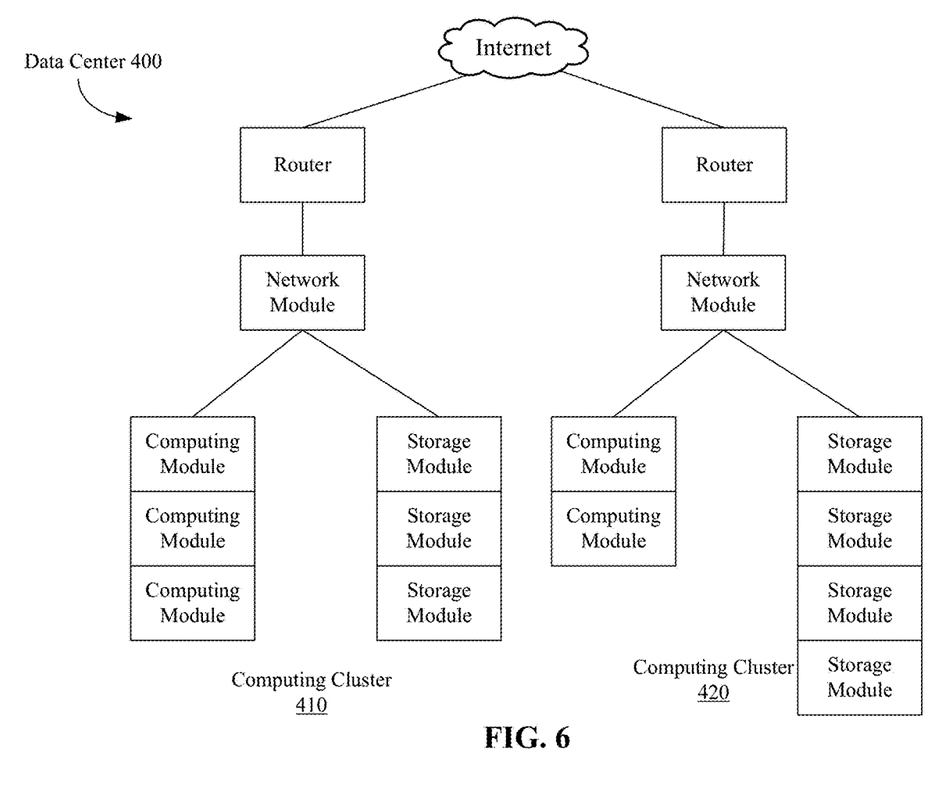
FIG. 6 is a schematic architectural diagram of a data center according to a fourth embodiment.

FIG. 6 is a schematic architectural diagram of a data center according to a fourth embodiment. As shown in FIG. 6, a data center 400 includes a first computing cluster 410 and a second computing cluster 420. Either of the first computing cluster 410 and the second computing cluster 420 includes a network module. The network module is connected to the Internet by using a router.

A difference between the first computing cluster 410 and the second computing cluster 420 lies in the number of computing modules and storage modules. For example, the first computing cluster 410 is configured to provide a browser game service. It may be understood that a browser game has high requirements for both computing capacity and storage capacity. Therefore, the first computing cluster 410 may separately include three computing modules and three storage modules. The second computing cluster module 420, for example, provides a network hard disk service. It may be understood that the network hard disk service does not have a high requirement for computing, but has a high requirement for storage space. Therefore, the second computing module 420 may include two computing modules and three storage modules.

It may be understood that in the first computing cluster 410 and the second computing cluster 420, the modules may be pieced together, and the modules may be connected to each other by using a cable such as an optical cable or a copper cable.

Through comparison between the first computing cluster 410 and the second computing cluster 420, it can be known that the data center may be configured flexibly according to different requirements for cloud computing by piecing different quantities of data center micro-modules together, thereby effectively reducing construction time and costs of the data center.

In the present disclosure, IT devices of the Internet including a network, a server, a storage device, and the like are classified, corresponding power supply systems, cooling systems, management systems, cabinet systems, and the like are configured and encapsulated into different micro-modules separately, and a cold aisle containment or hot aisle containment manner is used, thereby implementing modular encapsulation, and modular deployment and application of IT infrastructures of the data center.

Finally, it should be noted that the above descriptions are merely preferred embodiments of the present application, and are not intended to limit the present disclosure in any form. Although the present disclosure has been disclosed above through the preferred embodiments, the embodiments are not intended to limit the present disclosure. A person skilled in the art can make some equivalent variations, alterations or modifications to the above-disclosed technical content without departing from the scope of the technical solutions of the present disclosure to obtain equivalent embodiments. Any simple alteration, equivalent change or modification made to the above embodiments according to the technical essence of the present disclosure without departing from the content of the technical solutions of the present disclosure shall fall within the scope of the technical solutions of the present disclosure.

What is claimed is:

1. A data center, assembled by a plurality of data center micro-modules including a first data center micro-module enclosed in a first enclosure, a second data center micro-module enclosed in a second enclosure, and a third data center micro-module enclosed in a third enclosure, the plurality of data center micro-modules being connected to each other by using a cable wherein:

the first data center micro-module enclosed in the first enclosure comprises a first computing server that comprises a network core switch, a firewall and a security server, and a first cooling system that is configured to provide cooling for the first computing server using a combination of air conditioners and air deflectors;

the second data center micro-module enclosed in the second enclosure comprises a second computing server configured to accomplish user access and data caching, and a second cooling system that is configured to provide cooling for the second computing server using a respective plurality of air conditioner without using any air deflectors;

the third data center micro-module enclosed in the third enclosure comprises a third computing server configured as a storage server, and a third cooling system that is configured to provide cooling for the third computing server using a respective plurality of air conditioner without using any air deflectors; and the second cooling system is configured to provides enhanced cooling compared to the first cooling system without using any air deflectors, while the third cooling system is configured to provide reduced cooling compared to the first cooling system without using any air deflectors.

2. A data center according to claim 1, wherein the first data center micro-module includes a first cabinet system, a first power supply system, and the first cooling system that are inside the first enclosure, wherein:

the first cabinet system is configured to install the first computing server;

the first power supply system is configured to supply power for the first computing server and the first cooling system; and the first enclosure being further externally provided with an interface configured to connect to another data center micro-module or connection apparatus.

3. The data center according to claim 1, wherein the second data center micro-module includes a second cabinet system, the second computing server is disposed inside the second cabinet system, and at least one side of the second cabinet system is adjacent to the second cooling system.

4. The data center according to claim 1, wherein the third data center micro-module includes a third power supply system, the third power supply system comprises an uninterruptible power supply and a power distribution system that is configured to distribute power to the third computing server and the third cooling system.

5. The data center according to claim 2, wherein cabling of the first power supply system is performed at top of the first enclosure.

6. The data center according to claim 2, wherein the first cooling system comprises a first air conditioner, a cooling capacity distribution unit that is configured to control the first air conditioner, and a first air deflector that is configured to control wind direction.

7. The data center according to claim 2, further comprising a management system configured to control the first power supply system, the first cooling system and the first computing server.

8. The data center according to claim 7, wherein the management system further comprises an access control apparatus and a monitoring apparatus that are configured to perform access control management and monitoring respectively, wherein the monitoring apparatus is configured to monitor a working state of the first power supply system, a working state of the first cooling system, and a working state of the first computing server.

9. The data center according to claim 2, wherein the interface comprises a network interface, a power supply interface and an air-conditioner water-pipe interface.

* * * * *